（12）United States Patent
Yu

(10) Patent No.: US 6,764,957 B2
(45) Date of Patent: Jul. 20, 2004

(54) METHOD FOR FORMING CONTACT OR VIA PLUG

(75) Inventor: Cheng-Ta Yu, I-Lan (TW)

(73) Assignee: Macronix International Co., Ltd., Hsinchu (TW)

( * ) Notice: Subject to any disclaimer, the term of this patent is extended or adjusted under 35 U.S.C. 154(b) by 91 days.

(21) Appl. No.: 10/064,765

(22) Filed: Aug. 15, 2002

(65) Prior Publication Data

US 2004/0009663 A1 Jan. 15, 2004

(30) Foreign Application Priority Data

Jul. 11, 2002  (TW) ........................................ 91115387 A

(51) Int. Cl.⁷ .............................................. H01L 21/31
(52) U.S. Cl. ........................ 438/725; 438/780; 438/790; 29/825; 216/37
(58) Field of Search ................................. 438/725, 733, 438/780, 789, 790; 29/829, 830, 852, 846, 825; 216/2, 37

(56) References Cited

U.S. PATENT DOCUMENTS 5,915,177 A * 6/1999 Tseng .......................... 438/594
6,211,092 B1 * 4/2001 Tang et al. .................. 438/725
6,235,214 B1 * 5/2001 Deshmukh et al. .......... 438/719
6,277,544 B1 * 8/2001 Singh et al. ................. 430/313
6,284,149 B1 * 9/2001 Li et al. ...................... 438/725
6,383,941 B1 * 5/2002 Shen et al. .................. 438/725
6,573,177 B1 * 6/2003 Liang et al. ................. 438/637
6,613,686 B2 * 9/2003 Nishizawa .................. 438/725

* cited by examiner

Primary Examiner—Kamand Cuneo
Assistant Examiner—Lisa Kilday
(74) Attorney, Agent, or Firm—Jiang Chyun IP Office

(57) ABSTRACT

A method for forming a contact or via plug is described. A dielectric layer and a patterned photoresist layer are sequentially formed on a substrate. A portion of the exposed dielectric layer is removed to form a first opening. A first liner is formed on the surfaces of the photoresist layer. An anisotropic etching process is conducted using the first liner and the photoresist layer as a mask to remove a portion of the dielectric layer under the first opening to form a second opening incorporating the first opening. A second liner is formed on the photoresist layer covering the first liner. Then, the above etching step is repeated to form a third opening that incorporates the second opening and exposes the substrate. The second liner, the first liner and the photoresist layer are removed, and then a conductive material is filled into the third opening to form a contact or via plug.

20 Claims, 8 Drawing Sheets

METHOD FOR FORMING CONTACT OR VIA PLUG

CROSS REFERENCE TO RELATED APPLICATIONS

This application claims the priority benefit of Taiwan application serial no. 91115387, filed Jul. 11, 2002.

BACKGROUND OF INVENTION

1. Field of Invention

The present invention relates to a method for fabricating a semiconductor device. More particularly, the present invention relates to a method for forming a contact or via plug with small dimensions by using multi-step etching.

2. Description of Related Art

In accompany with the advances of semiconductor technology, semiconductor devices are continuously miniaturized. In order to further increase the device integration in deep sub-micron VLSI techniques, multi-level metal interconnect structures containing more than two metal layers are required. In a multi-level metal interconnect process, two metal layers are electrically connected by via plugs formed in the isolating layer between them, wherein the via plugs are fabricated by forming openings in the isolating layer and filling the openings with metal.

In a method for forming a contact or via plug in the prior art, a dielectric layer is formed on a substrate having a first metal interconnect layer thereon. The dielectric layer is patterned to form an opening exposing the first metal interconnect layer, and then the opening is filled with metal to form a metal contact or via plug. Thereafter, a second metal interconnect layer is formed on the substrate contacting with the metal contact or via plug to electrically connect with the first metal interconnect layer.

As the integration of integrated circuits (IC) continuously gets higher, the metal interconnects and the metal via plugs are miniaturized correspondingly as well as the devices. However, it is hard to form a contact or via plug having a smaller bottom portion because of the restrictions imposed by lithography process and etching process. Meanwhile, filling metal into an opening having a high aspect ratio is usually a challenge.

SUMMARY OF INVENTION

Accordingly, this invention provides a method for forming a contact or via plug to break through the restrictions imposed by lithography process and etching process, so as to form a contact or via plug with a smaller bottom portion.

This invention also provides a method for forming a contact or via plug to solve the problem that a small contact/via hole with a high aspect ratio cannot be easily filled with metal.

In a method for forming a contact or via plug of this invention, a dielectric layer is formed on a substrate and then a patterned photoresist layer is formed on the dielectric layer. A portion of the dielectric layer exposed by the photoresist layer is removed to form a first opening with the photoresist layer as a mask. A first liner is then formed on the surfaces of the photoresist layer. The first liner comprises a material such as polymer and is formed with, for example, plasma-enhanced chemical vapor deposition (PECVD). A portion of the dielectric layer under the first opening is removed to form a second opening by using the first liner and the photoresist layer as a mask. The second opening incorporates the first opening, and the etching rate of the first liner is smaller than that of the dielectric layer in the etching process. A second liner is formed on the photoresist layer covering the first liner. The second liner comprises a material such as polymer and is formed with, for example, plasma-enhanced chemical vapor deposition (PECVD). A portion of the dielectric layer under the second opening is removed to form a third opening exposing the substrate by using the second liner and the photoresist layer as a mask. The third opening incorporates the second opening, and the etching rate of the second liner is smaller than that of the dielectric layer in the etching process. The second liner, the first liner and the photoresist layer are removed and then a conductive material is filled into the third opening to form a contact or via plug. The contact or via plug formed by using the multi-step etching method of this invention has a bottom width smaller than the top width thereof.

In another method for forming a contact or via plug of this invention, a dielectric layer is formed on a substrate and then a patterned photoresist layer is formed on the dielectric layer. A portion of the dielectric layer exposed by the photoresist layer is removed to form a first opening with the photoresist layer as a mask. Thereafter, the photoresist layer is removed and a first liner is formed on the dielectric layer and in the first opening. The first liner preferably comprises silicon nitride or a metal material. A portion of the dielectric layer under the first opening is removed to form a second opening by using the first liner as a mask. The second opening incorporates the first opening, and the etching rate of the first liner is smaller than that of the dielectric layer in the etching process. Thereafter, a second liner is formed on the substrate covering the first liner. The second liner preferably comprises silicon nitride or a metal material. A portion of the dielectric layer under the second opening is removed to form a third opening exposing the substrate by using the second liner as a mask. The third opening incorporates the second opening, and the etching rate of the second liner is smaller than that of the dielectric layer in the etching process. The second liner and the first liner are removed and then a conductive material is filled into the third opening to form a contact or via plug. The contact or via plug formed by using the multi-step etching method of this invention has a bottom width smaller than the top width thereof. Besides, it is also feasible to directly fill a conductive material into the third opening without removing the first liner and the second liner that comprises silicon nitride or metal. If the first and the second liners comprise silicon nitride, they are taken as a part of the dielectric layer. If the first and the second liners comprise metal, they are taken as a part of the contact or via plug.

Since a multi-step etching process is used to form a contact/via hole having a smaller bottom portion in the method for forming a contact or via plug of this invention, the restrictions imposed by current lithography and etching processes can be broken through.

Moreover, the contact/via hole formed by using the method of this invention has a top width larger than the bottom width thereof, so the metal (conductive material) can be easily filled into the contact/via hole.

Furthermore, since the contact or via plug formed by using the method of this invention has a wider top portion, the resistance of the contact or via plug can be reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

FIGS. 1A~1G illustrate a process flow of forming a contact or via plug according to the first embodiment of this invention in a cross-sectional view.

Figure 1A:
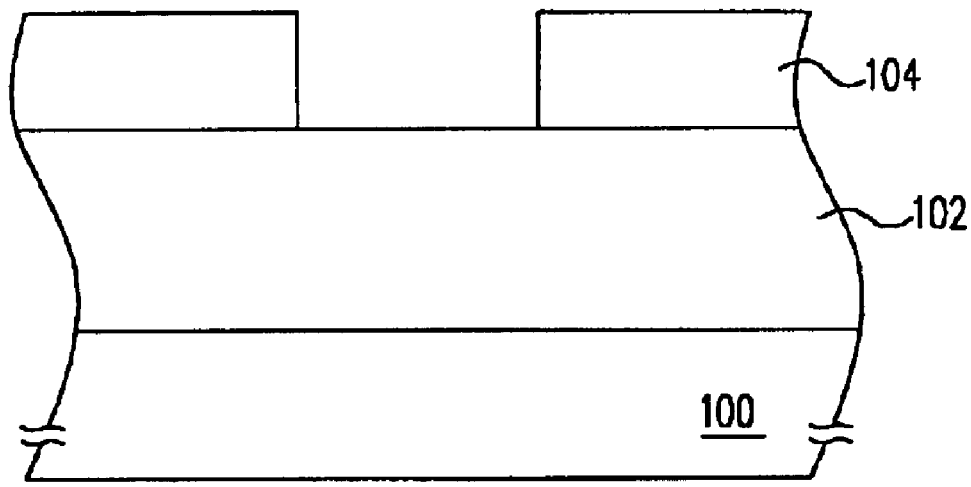
FIGS. 1A~1G illustrate a process flow of forming a contact or via plug according to a first embodiment of this invention in a cross-sectional view.

Refer to FIG. 1A, a substrate 100 is provided. A dielectric layer 102, such as a silicon oxide layer, is formed on the substrate 100. A patterned photoresist layer 104 is then formed on the dielectric layer 102.

Figure 1B:
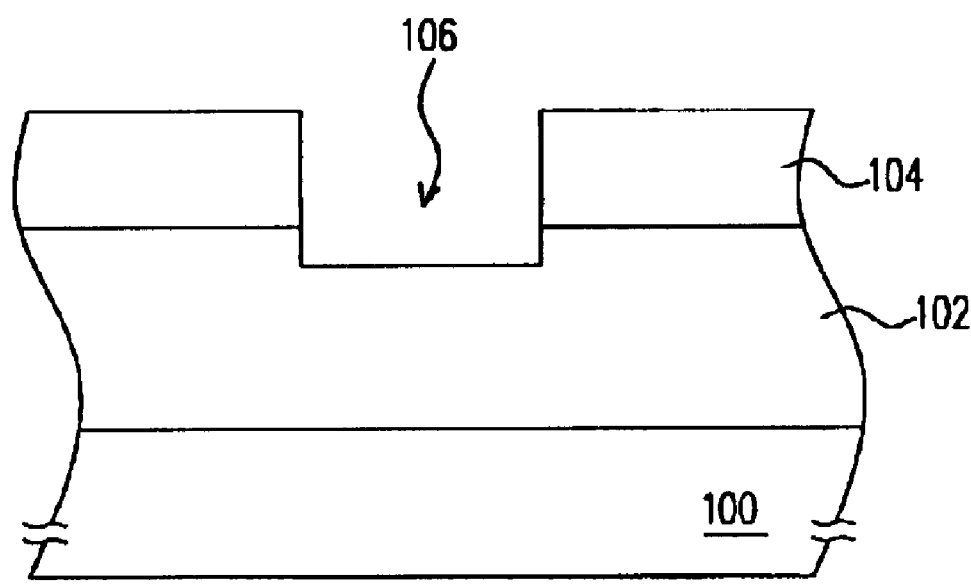

Refer to FIG. 1B, an anisotropic etching process is performed to removed a portion of the exposed dielectric layer 102 to form a first opening 106 with the photoresist layer 104 as a mask.

Figure 1C:
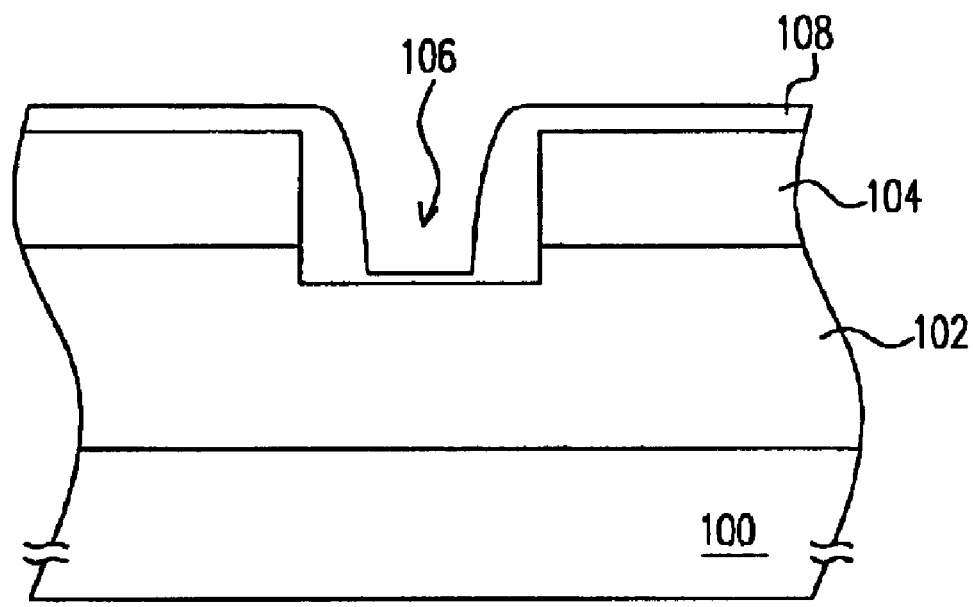

Refer to FIG. 1C, a first liner 108 is formed on the surfaces of the photoresist layer 104 and possibly on the surface of the dielectric layer 102 exposed by the first opening 106. In this embodiment, the first liner 108 comprises a material such as polymer and is formed with, for example, plasma-enhanced chemical vapor deposition (PECVD). The reaction gas used in the PECVD process mainly comprises difluoromethane ($CH_2F_2$), difluoromethane/octafluorobutene ($CH_2F_2/C_4F_8$) mixture, or difluoromethane/trifluoromethane ($CH_2F_2/CHF_3$). The PECVD process is conducted under 1~100 mTorr and with a power of about 500~2000W, a self-bias of approximately 0~400V and a deposition rate of about 600~6000 Å/min, for example. Moreover, argon (Ar), carbon monoxide (CO), oxygen ($O_2$) and nitrogen ($N_2$) etc., can be optionally added into the reaction gas used in the PECVD process.

Figure 1D:
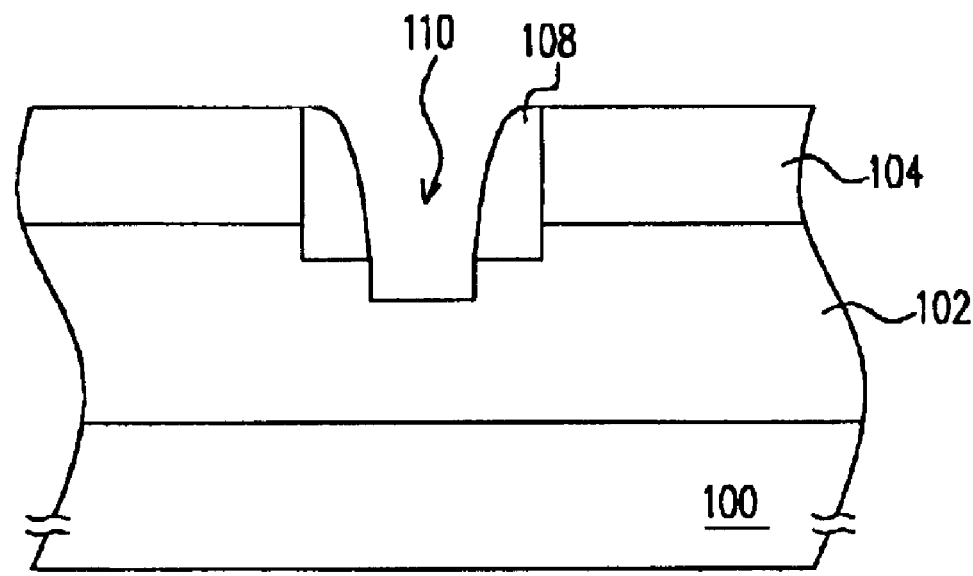

Refer to FIG. 1D, an anisotropic etching process is conducted using the first liner 108 and the photoresist layer 104 as a mask to remove a portion of the dielectric layer 102 under the first opening 106 to form a second opening 110. The second opening 110 incorporates the first opening 106, and the etching rate of the first liner 108 is lower than that of the dielectric layer 102 in the etching process. During the anisotropic etching process, the portion of the first liner 108 on the sidewall of the first opening 106 still remains, but the portion at the bottom of the first opening 106 is removed at the beginning of the process. Therefore, the dielectric layer 102 exposed by the first liner 108 and the photoresist layer 104 can be etched to form the second opening 110 that incorporates the first opening 106.

In this invention, it is noted that the first liner 108 can be formed with a thickness at the bottom of the first opening 106 being smaller than that on the top of the photoresist layer 104, or even approaching to zero, by adjusting the deposition conditions. Thus, when the portion of the first liner 108 at the bottom of the first opening 106 is completely removed, the portion on the top of the photoresist layer 104 still remains and can serve as an etching mask thereafter.

Figure 1E:
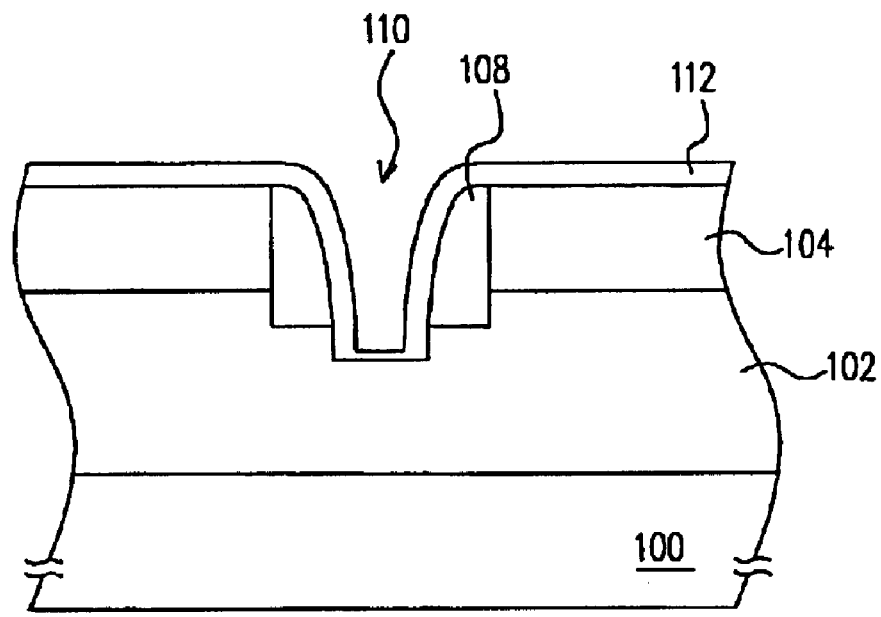

Refer to FIG. 1E, a second liner 112 is formed on the surfaces of the photoresist layer 104 and the first liner 108, and possibly on the surface of the dielectric layer 102 exposed by the second opening 110. In this embodiment, the second liner 112 comprises a material such as polymer and is formed with PECVD, for example. Since the second liner 112 comprising polymer can be formed with the same method for forming the first liner 108, descriptions of the forming method are omitted.

Figure 1F:
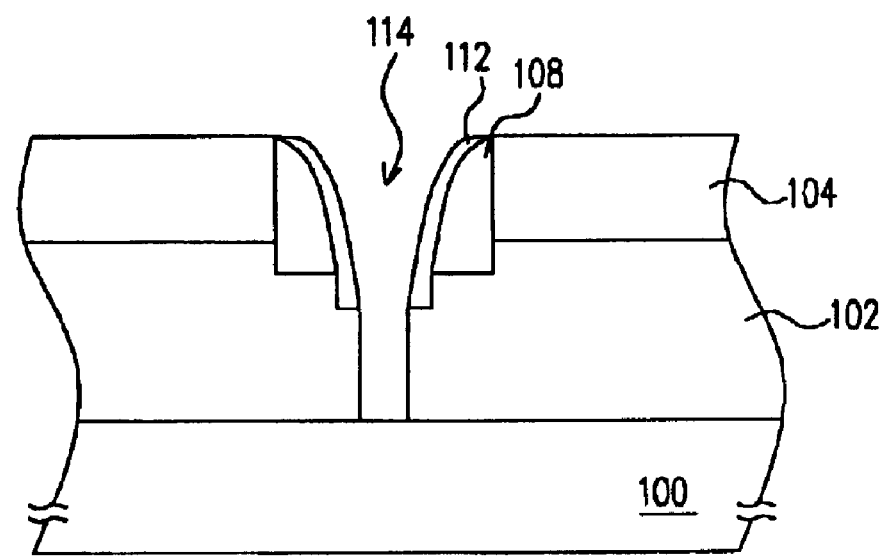

Refer to FIG. 1F, an anisotropic etching process is conducted using the second liner 112 and the photoresist layer 104 as a mask to remove a portion of the dielectric layer 102 under the second opening 110 to form a third opening 114 exposing the substrate 100. The third opening 114 incorporates the second opening 110, and the etching rate of the second liner 12 is lower than that of the dielectric layer 102 in the etching process. During the anisotropic etching process, the portion of the second liner 112 on the sidewall of the second opening 110 still remains, but the portion at the bottom of the second opening 110 is removed at the beginning of the etching process. Therefore, the dielectric layer 102 exposed by the second liner 112 and the photoresist layer 104 can be etched to form the third opening 114 that incorporates the second opening 110.

In this invention, it is noted that the second liner 112 can be formed with a thickness at the bottom of the second opening 110 being smaller than that on the top of the photoresist layer 104, or even approaching to zero, by adjusting the process conditions. Thus, when the portion of the second liner 112 at the bottom of the second opening 110 is completely removed, the portion on the top of the photoresist layer 104 still remains and can serve as an etching mask thereafter.

Figure 1G:
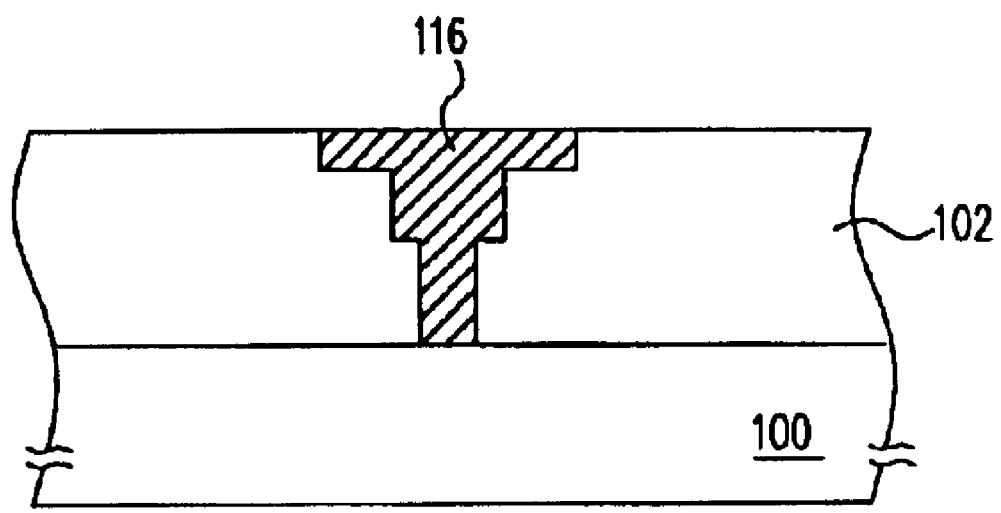

Refer to FIG. 1G, the second liner 112, the first liner 108 and the photoresist layer 104 are removed, and then the third opening 114 is filled with an electrically conductive material to form a contact or via plug. The method for filling the third opening 114 comprises, for example, deposit the conductive material all over the substrate 100 and performing etching-back or chemical mechanical polishing (CMP) to remove the conductive material outside the third opening 114.

In this embodiment, the multi-step etching process is used to form a contact/via hole (the third opening) 114 having a smaller bottom portion, so the restrictions imposed by current lithography and etching processes can be broken through. Moreover, the contact/via hole 114 formed by using the method of this invention has a top width larger than the bottom width thereof, so the conductive material can be easily filled into the contact/via hole. Furthermore, since the contact or via plug 116 formed by using the method of this invention has a wider top portion, the contact/via resistance can be reduced.

Second Embodiment

FIGS. 2A~2H illustrate a process flow of forming a contact or via plug according to the second embodiment of this invention in a cross-sectional view.

Figure 2A:
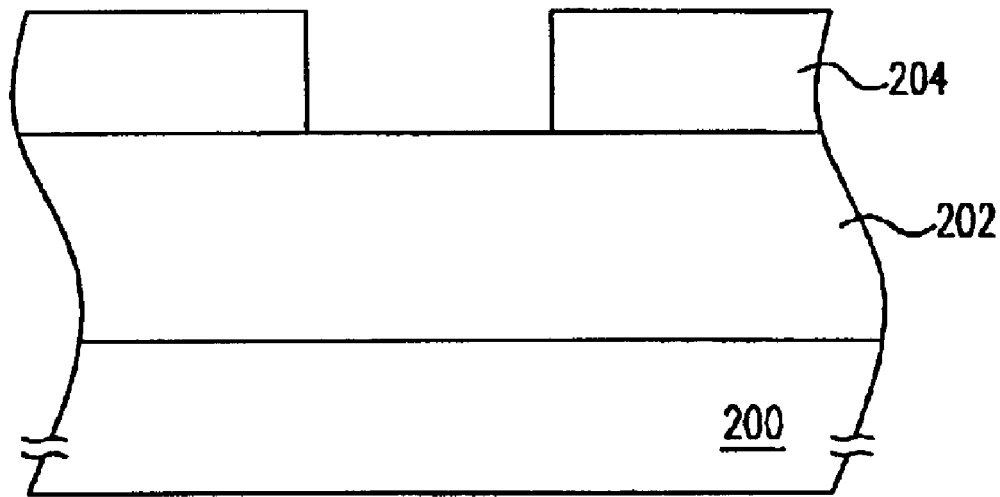
FIGS. 2A~2H illustrate a process flow of forming a contact or via plug according to a second embodiment of this invention in a cross-sectional view.

Refer to FIG. 2A, a substrate 200 is provided. A dielectric layer 202, such as a silicon oxide layer, is formed on the substrate 200. A patterned photoresist layer 204 is then formed on the dielectric layer 202.

Figure 2B:
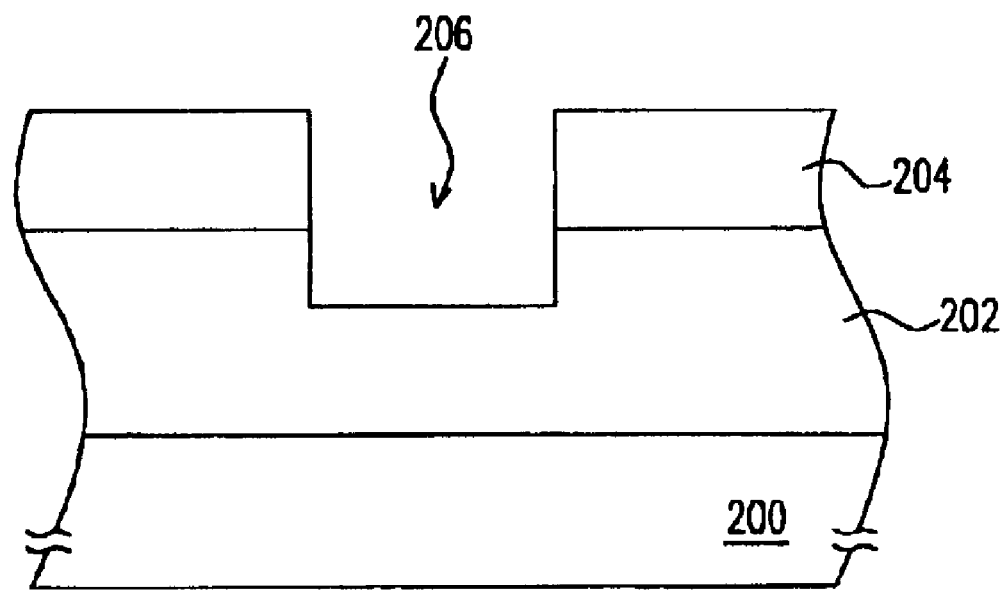

Refer to FIG. 2B, an anisotropic etching process is performed to removed a portion of the exposed dielectric layer 202 to form a first opening 206 with the photoresist layer 204 as a mask.

Figure 2C:
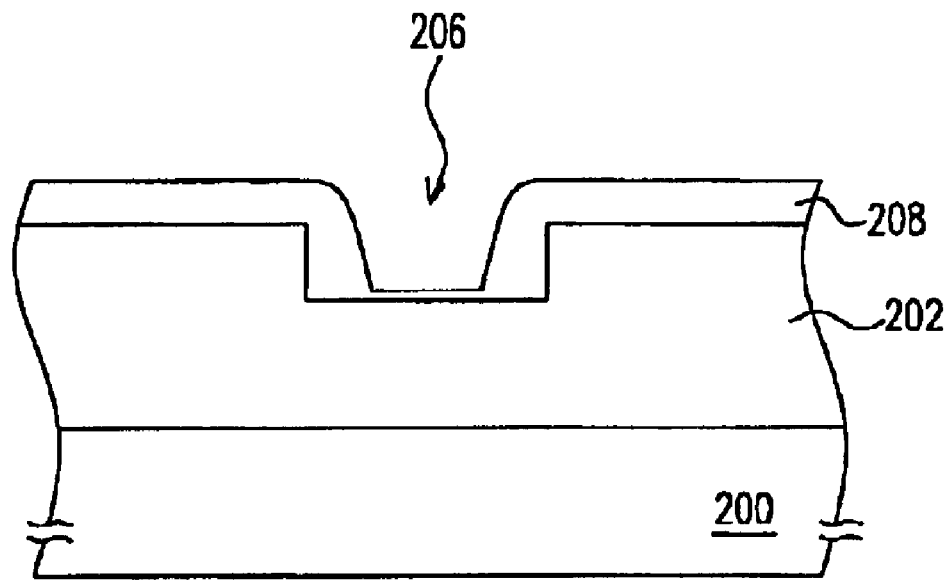

Refer to FIG. 2C, the photoresist layer 204 is removed. A first liner 208 is formed on the dielectric layer 202 and in the first opening 206. In this embodiment, the first liner 208 preferably comprises silicon nitride or a metal material, and can be formed by any known deposition method. It is noted that the first liner 208 can be formed with a thickness at the bottom of the first opening 206 being smaller than that on the top of the dielectric layer 202 by adjusting the deposition conditions.

Figure 2D:
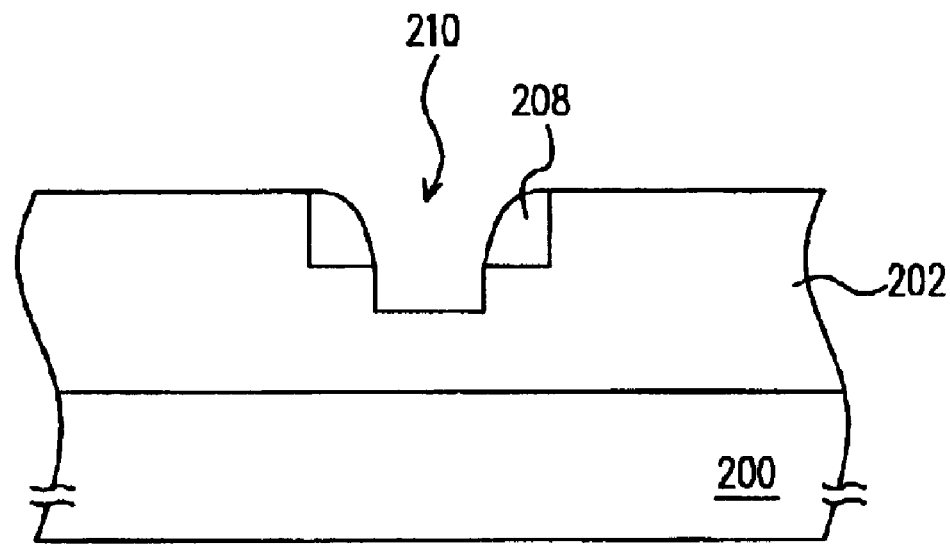

Refer to FIG. 2D, an anisotropic etching process is conducted to remove the first liner 208 at the bottom of the first opening 206 and then remove a portion of the exposed dielectric layer 202 to form a second opening 210 with the remaining first liner 208 as a mask. The second opening 210 incorporates the first opening 206, and the etching rate of the first liner 208 is lower than that of the dielectric layer 202 in the etching process. Since the first liner 208 is formed thinner at the bottom of the first opening 206, when the portion of the first liner 208 at the bottom of the first opening 206 is completely removed, the portion remaining on the top of the dielectric layer 202 still remains and can serve as an etching mask thereafter. Meanwhile, the first liner 208 on the sidewall of the first opening 206 remains after the anisotropic etching process.

Figure 2E:
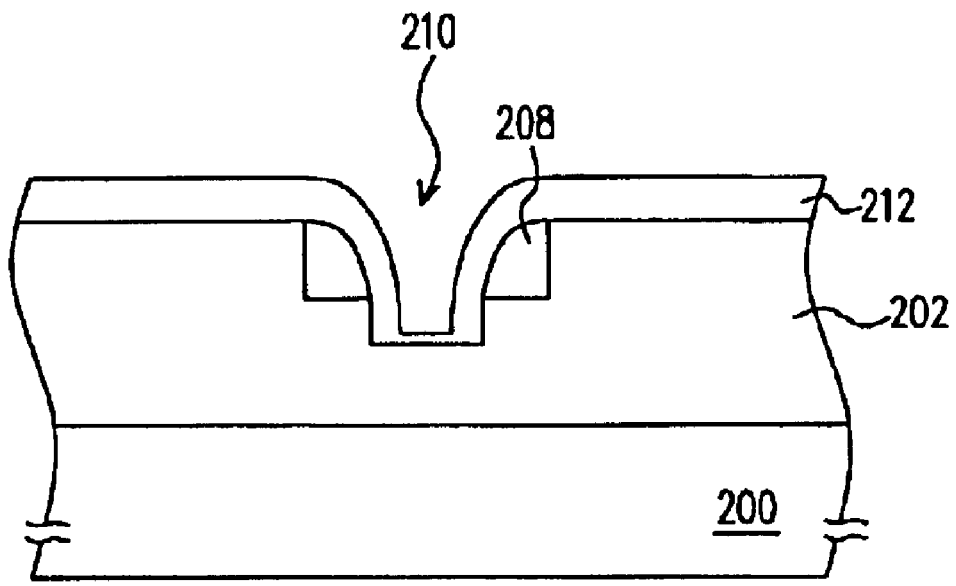

Refer to FIG. 2E, a second liner 212 is formed on the dielectric layer 202 and in the second opening 210. In this embodiment, the second liner 212 preferably comprises silicon nitride or a metal material, and can be formed by any known deposition method. It is noted that the second liner 212 can be formed with a thickness at the bottom of the second opening 210 being smaller than that on the top of the dielectric layer 202 by adjusting the deposition conditions.

Figure 2F:
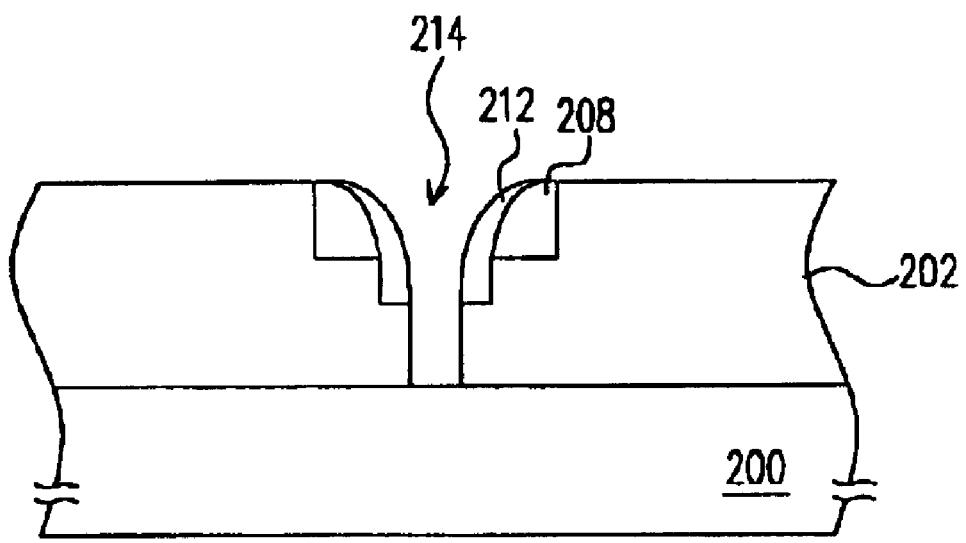

Refer to FIG. 2F, an anisotropic etching process is conducted to remove the second liner 212 at the bottom of the second opening 210 and then remove the exposed dielectric layer 202 to form a third opening 214 with the remaining second liner 212 as a mask. The third opening 214 exposes the substrate 200 and incorporates the second opening 210, and the etching rate of the second liner 212 is lower than that of the dielectric layer 202 in the etching process. Since the second liner 212 is formed thinner at the bottom of the second opening 210, when the portion of the second liner 212 at the bottom of the second opening 210 is removed, the portion on the top of the dielectric layer 202 still remains. The second liner 212 remaining on the top of the dielectric layer 202 can serve as an etching mask for forming the third opening 214. Meanwhile, the second liner 212 on the sidewall of the second opening 210 remains after the anisotropic etching process.

Figure 2G:
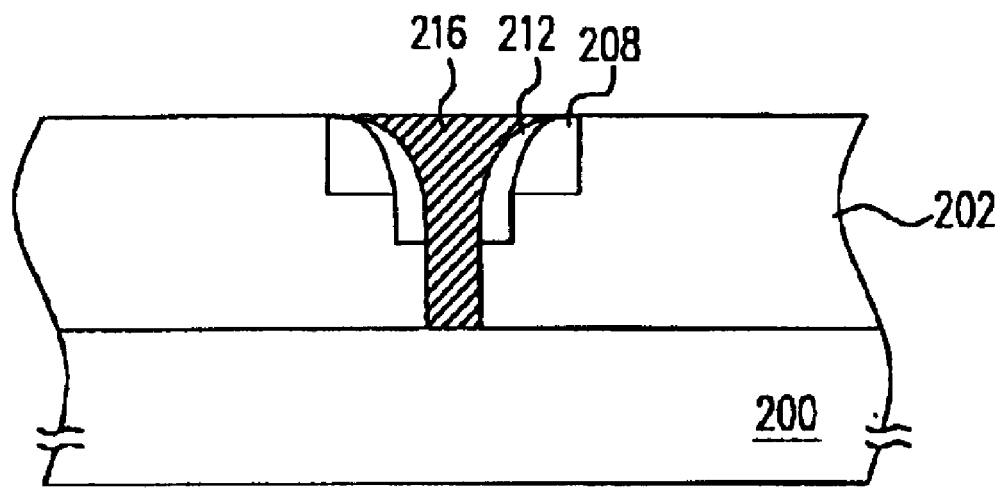
Figure 2H:
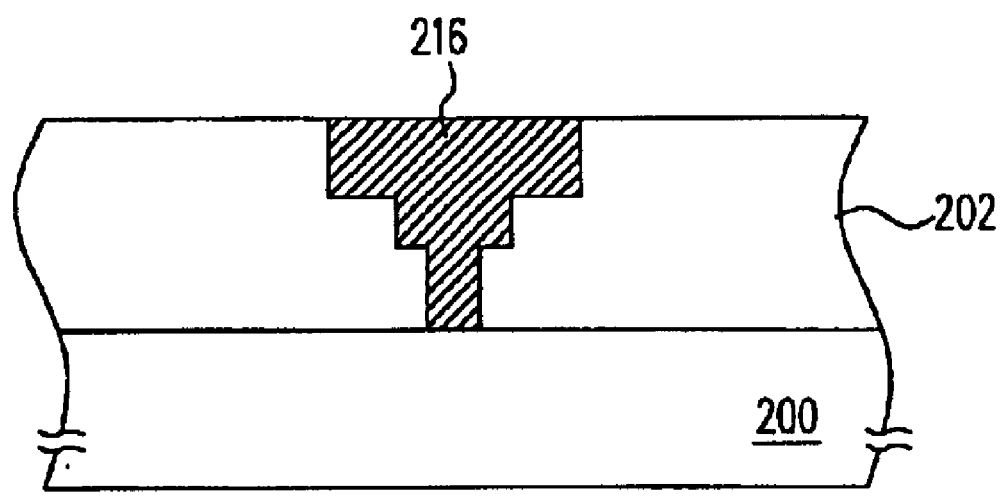

Refer to FIG. 2G, a conductive material is directly filled into the third opening 214 to form a contact or via plug 216. The method for filling the third opening 214 comprises, for example, depositing the conductive material all over the substrate 200 and performing etching-back or chemical mechanical polishing (CMP) to remove the conductive material outside the third opening 214. In this embodiment, the contact or via plug is formed without removing the first liner 208 and the second liner 212 previously because the first liner 208 and the second liner 212 comprise metal or silicon nitride. If the first and the second liners 208 and 212 comprise metal, they are taken as a part of the contact or via plug 216; if the first and the second liners 208 and 212 comprise silicon nitride, they can serve as an insulating layer.

Nevertheless, in this embodiment, the contact or via plug can alternatively be formed by filling the conductive material into the third opening 214 after the first liner 208 and the second liner 212 are removed.

In this embodiment, the multi-step etching process is used to form a contact/via hole 214 having a small bottom portion, so the restrictions imposed by current lithography and etching processes can be broken through. Moreover, the contact/via hole 214 formed by using the method of this invention has a top width larger than the bottom width thereof, and the conductive material can be easily filled into the contact/via hole 214. Furthermore, since the contact or via plug 216 formed by using the method of this invention has a wider top portion, the contact/via resistance can be reduced.

The contact/via holes are formed with three-step etching in the first and the second embodiments of this invention, however, the methods for forming a contact/via hole is not only restricted to three-step etching, but also include two-step etching and the etching methods comprising more than three etching steps.

As mentioned above, since a multi-step etching process is used to form a contact/via hole having a small bottom portion in the method for forming a contact or via plug of this invention, the restrictions imposed by current lithography and etching processes can be broken through. Moreover, the contact/via hole formed by using the method of this invention has a top width larger than the bottom width thereof, and the metal (conductive material) can be easily filled into the contact/via hole. Furthermore, since the contact or via plug formed by using the method of this invention has a wider top portion, the contact/via resistance can be reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a contact or via plug, comprising:
    forming a dielectric layer on a substrate;
    forming a patterned photoresist layer on the dielectric layer;
    removing a portion of the dielectric layer exposed by the photoresist layer to form a first opening by using the patterned photoresist layer as a mask;
    forming a first liner on surfaces of the photoresist layer;
    removing a portion of the dielectric layer under the first opening to form a second opening by using the patterned photoresist layer and the first liner as a mask, wherein the second opening incorporates the first opening;
    forming a second liner on the photoresist layer covering the first liner;
    removing a portion the dielectric layer under the second opening to form a third opening exposing the substrate by using the patterned photoresist layer and the second liner as a mask, wherein the third opening incorporates the second opening;
    removing the second liner, the first liner and the photoresist layer; and
    filling a conductive material into the third opening to form a contact or via plug.

2. The method of claim 1, wherein the first liner and the second liner have etching rates lower than an etching rate of the dielectric layer.

3. The method of claim 1, wherein each of the first liner and the second liner comprises a polymer layer.

4. The method of claim 1, wherein the dielectric layer comprises silicon oxide.

5. The method of claim 1, wherein forming the first liner and the second liner comprises performing a plasma-enhanced chemical vapor deposition (PECVD) process.

6. The method of claim 5, wherein the PECVD process uses a reaction gas mainly comprising $CH_2F_2$, $CH_2F_2/C_4F_8$ mixture, or $CH_2F_2/CHF_3$ mixture.

7. The method of claim 5, wherein the PECVD process further uses an optionally additive gas including argon (Ar), carbon monoxide (CO), oxygen ($O_2$) and nitrogen ($N_2$).

8. The method of claim 5, wherein the PECVD process is performed under a pressure of 1~100 mTorr.

9. The method of claim 5, wherein the PECVD process is performed with a power of 500~2000 W.

10. A method for forming a contact or via plug, comprising:

forming a dielectric layer on a substrate;

forming a patterned photoresist layer on the dielectric layer;

removing a portion of the dielectric layer exposed by the photoresist layer to form a first opening by using the patterned photoresist layer as a mask;

removing the photoresist layer;

forming a first liner on the dielectric layer and in the first opening;

removing a portion of the dielectric layer under the first opening to form a second opening by using the first liner as a mask, wherein the second opening incorporates the first opening;

forming a second liner on the dielectric layer covering the first liner;

removing a portion of the dielectric layer under the second opening to form a third opening exposing the substrate by using the second liner as a mask, wherein the third opening incorporates the second opening; and filling a conductive material into the third opening to form a contact or via plug.

11. The method of claim 10, further comprising removing the second liner and the first liner before filling a conductive material into the third opening.

12. The method of claim 10, wherein the first liner and the second liner have etching rates lower than an etching rate of the dielectric layer.

13. The method of claim 10, wherein the first liner and the second liner comprise silicon nitride.

14. The method of claim 10, wherein the first liner and the second liner comprise a metal.

15. The method of claim 10, wherein the dielectric layer comprises silicon oxide.

16. A method for forming a contact or via plug, comprising:

forming a dielectric layer on a substrate;

removing a portion of the dielectric layer to form a first opening;

forming a first liner on the dielectric layer and in the first opening;

removing a portion of the dielectric layer under the first opening to form a second opening by using the first liner as a mask, wherein the second opening incorporates the first opening;

forming a second liner on the dielectric layer covering the first liner;

removing a portion of the dielectric layer under the second opening to form a third opening exposing the substrate by using the second liner as a mask, wherein the third opening incorporates the second opening; and directly filling a conductive material into the third opening to form a contact or via plug without removing the first liner and the second liner in advance.

17. The method of claim 16, wherein the first liner and the second liner have etching rates lower than an etching rate of the dielectric layer.

18. The method of claim 16, wherein the first liner and the second liner comprise silicon nitride.

19. The method of claim 16, wherein the first liner and the second liner comprise a metal.

20. The method of claim 16, wherein the dielectric layer comprises silicon oxide.

* * * * *